United States Patent [19]
Hwang

[11] Patent Number: 6,077,767
[45] Date of Patent: Jun. 20, 2000

[54] MODIFIED IMPLEMENTATION OF AIR-GAP LOW-K DIELECTRIC FOR UNLANDED VIA

[75] Inventor: Tsing-Fong Hwang, Tainan, Taiwan

[73] Assignees: United Semiconductor Corp.; United Microelectronics Corp., both of Hsinchu, Taiwan

[21] Appl. No.: 09/389,823

[22] Filed: Sep. 3, 1999

[51] Int. Cl.[7] .......................... H01L 21/4763; H01L 21/31
[52] U.S. Cl. ........................... 438/619; 438/624; 438/763; 438/422
[58] Field of Search ...................................... 438/619, 763, 438/778, 760, 622, 624, 637, 632, 623, 646, 783, 422, 424, 421, 435, 782, 761, 698, 787, 438

[56] References Cited

U.S. PATENT DOCUMENTS 5,814,555   9/1998   Bandyopadhyay et al. ............ 438/619

*Primary Examiner*—Charles Bowers
*Assistant Examiner*—Hsien Ming Lee
*Attorney, Agent, or Firm*—Thomas, Kayden, Horstemeyer & Risley

[57] ABSTRACT

A method for fabricating a multilevel interconnect, where a first and a second conducting wires are formed respectively on a substrate, while a part of the substrate between the first and the second conducting wires is exposed. A first dielectric layer is then formed to cover the substrate as well as the first and the second conducting wires, wherein the first dielectric layer has an air gap formed between the first and the second conducting wires. An anti-etch layer is formed on the first dielectric layer above the air gap, while a second dielectric layer is then formed on the anti-etch layer and the first dielectric layer. A via opening which exposes the first conducting wire is then formed by etching, followed by forming a barrier layer which covers the profile of the via opening and the exposed surface of the first conducting layer. Consequently, a via plug is formed to fill the via opening.

14 Claims, 3 Drawing Sheets

MODIFIED IMPLEMENTATION OF AIR-GAP LOW-K DIELECTRIC FOR UNLANDED VIA

BACKGROUND OF THE INVENTION

1. Field of Invention

The present invention relates to a method of fabricating multi level interconnect. More particularly, the present invention relates to a modified implemenation of air-gap low-K dielectric for unlanded via.

2. Description of Related Art

The current integrated circuit device includes not only a field effect transistor (FET) and a bipolar device formed on the semiconductor substrate, but also a multilevel interconnect structure formed on the device. Different devices on the substrate can be connected by means of the multilevel interconnect structure. Among many integrated circuits, the multilevel interconnect structure extends in parallel with one or more arrays of conducting wires, while providing the function of the conducting wires in the devices formed by high integration stacking. When the size of the device is shrunk, an intrametal capacitance between the conducting wires obviously increases. As the data is transmitted with the conducting wires, unnecessary capacitive and inductive couplings are produced between the adjacent conducting wires in a narrow space. Such capacitive and inductive couplings reduce the speed for data transmission, especially during high-speed data transmission, while the increased energy consumption in this case also limits the efficiency of the device.

Referring to FIG. 1, an air gap 106 is formed in a dielectric layer between the conducting wires 102 in order to reduce the capacitive and inductive couplings between the multilevel interconnects. As the air has a smaller dielectric constant (about 1), the inter-metal dielectric (IMD) made with the air gap between the multilevel interconnects can reduce the dielectric constant and the capacitance between the parallel conducting wires, while improving the data transmission speed and the device efficiency.

Since a misalignment or an increase in critical dimension (CD) of an unlanded via opening (not shown) may occur during the formation of via opening 112, it is not easy to control an etching stopping point when the dielectric layers 110, 108, and 104 are made of similar materials. As a result, the via opening 112 can easily penetrate through the dielectric layers 110, 108, and 104, so that the air gap 106 is breached, resulting in an opening 106a extending form the via opening 112 and the air gap 106. The air gap 106 is not easily filled with a barrier layer 114, when the barrier layer 1 14 is formed by chemical vapor deposition (CVD) to cover the dielectric layer 110 and the profile of the via opening 112. Therefore, the reactant gas $WF_6$ diffuses into the air gap 106 and reacts with the oxide in the dielectric layer, producing a poisoned via in the subsequent step for forming the tungsten plug (not shown).

SUMMARY OF THE INVENTION

The invention provides a method of fabricating multilevel interconnects, and is briefly described as follows: a first conducting wire and a second conducting wire are formed on a substrate, such that the substrate surfaces between the first and the second conducting wires are exposed. A dielectric layer is formed to cover the substrate as well as the first and the second conducting wires. However, an air gap is formed in the first dielectric layer between the first and the second conducting wires. An anti-etch layer is formed on the first dielectric layer above the air gap, while a second dielectric layer is formed on the anti-etch layer and the first dielectric layer. A via opening which exposes the first conducting wire is formed, while a barrier layer is then formed to cover the second dielectric layer and the profile of the via opening. Consequently, a via plug is formed to fill the via opening. The anti-etch layer in this case may include insulating material, preferably silicon nitride, titanium oxide, or tantalum oxide. The anti-etch layer has a smaller etching rate than the first dielectric layer and the second dielectric layer, while the anti-etch layer has a smaller polishing rate than the first dielectric layer during CMP.

As the anti-etch layer has a smaller etching rate than the first dielectric layer and the second dielectric layer, the anti-etch layer may serve as an etching mask when the misalignment occurs during formation of a via. Thus, the via opening cannot penetrate the first dielectric layer and no air gap is breached. This solves the conventional problem of a poisoned via where the air gap is breached by the via opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2E are schematic diagrams illustrating a method for fabricating the multilevel interconnect according to the preferred embodiment of the invention.

Figure 1:
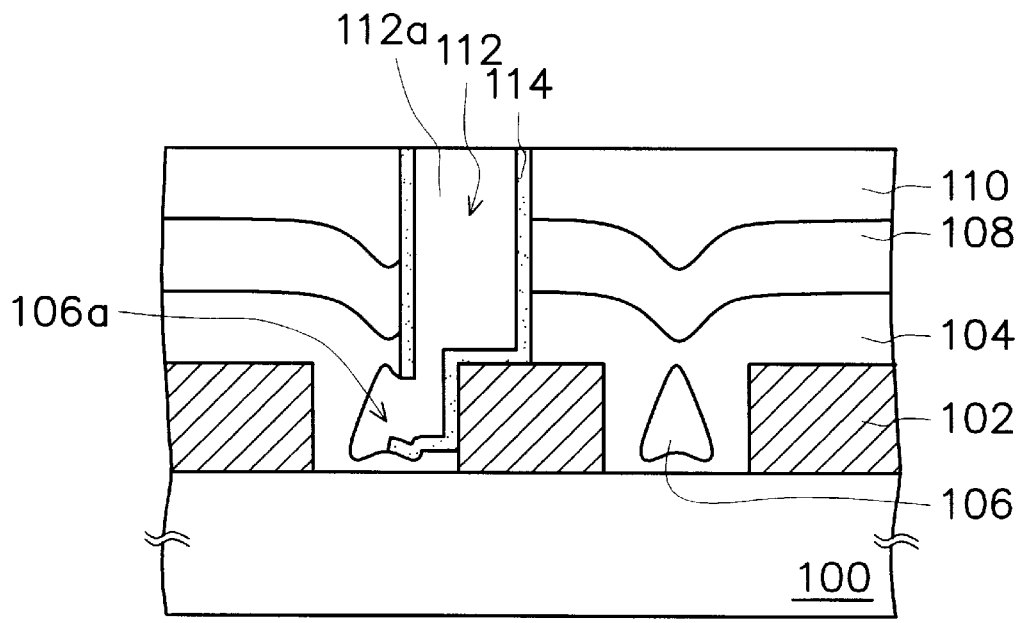
FIG. 1 is a schematic diagram illustrating the via opening which penetrates the first dielectric layer and connects to the air gap when misalignment occurs in the prior art.
Figure 2A:
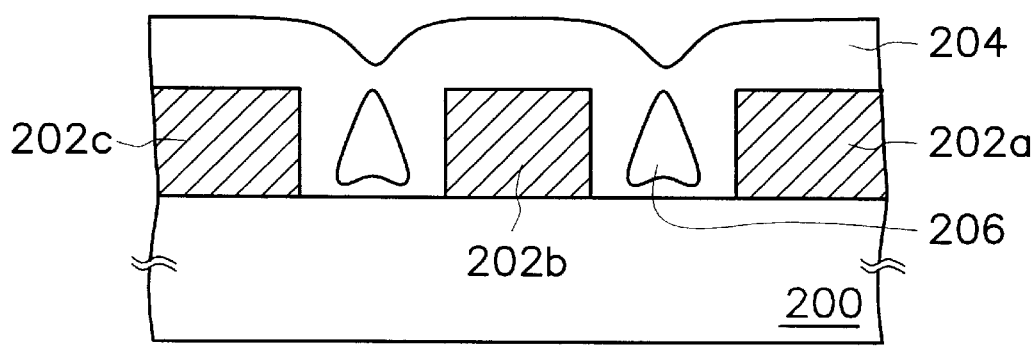
FIGS. 2A to 2E are schematic diagrams illustrating a method for fabricating the multilevel interconnect according to the preferred embodiment of the invention.

Referring to FIG. 2A, a substrate formed with semiconductor devices (not shown) is provided. Conducting wires 202a, 202b, 202c are formed on the substrate 200, wherein the conducting wires 202a, 202b, 202c serve as conducting wires of the device. For a clear description, the conducting wires 202a, 202b, 202c can be briefly represented as conducting wires 202. A dielectric layer 204 is formed to cover the substrate 200 and the conducting wires 202, wherein an air gap 206 is formed in the dielectric layer 204 between the conducting wires 202. The dielectric layer 204 may be a dielectric layer with poor step coverage and preferably includes silicon oxide formed by plasma enhanced chemical vapor deposition (PECVD), and has a thickness approximately between 2000–4000Å, and preferably of 3000Å on the conducting wires 202. When the gap between the conducting wires 202 is filled with the dielectric layer 204 made from the material resulting poor step coverage, an overhang is produced above the gap between the conducting wires 202. This makes it difficult to fill the space between the conducting wires with the dielectric layer 204 in the subsequent deposition process; thus, the dielectric layer 204 may close off the space to form the air gap 206 between the conducting wires 202.

Figure 2B:
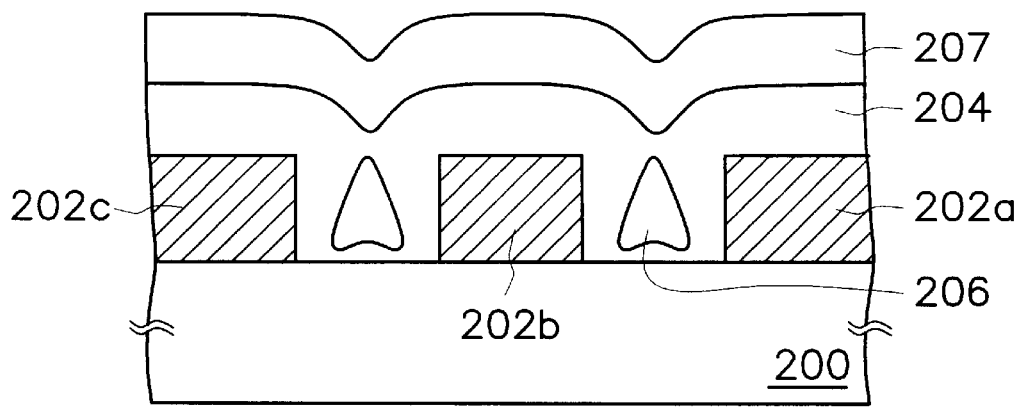

Referring to FIG. 2B, an anti-etch layer 207 is formed on the dielectric layer 204, wherein the anti-etch layer 207 has a smaller etching rate than the dielectric layer 204. The anti-etch layer 207 is preferably made of a silicon nitride layer, a titanium oxide layer, and a tantalum oxide layer formed by PECVD or photo-induced chemical vapor deposition (PICVD).

Figure 2C:
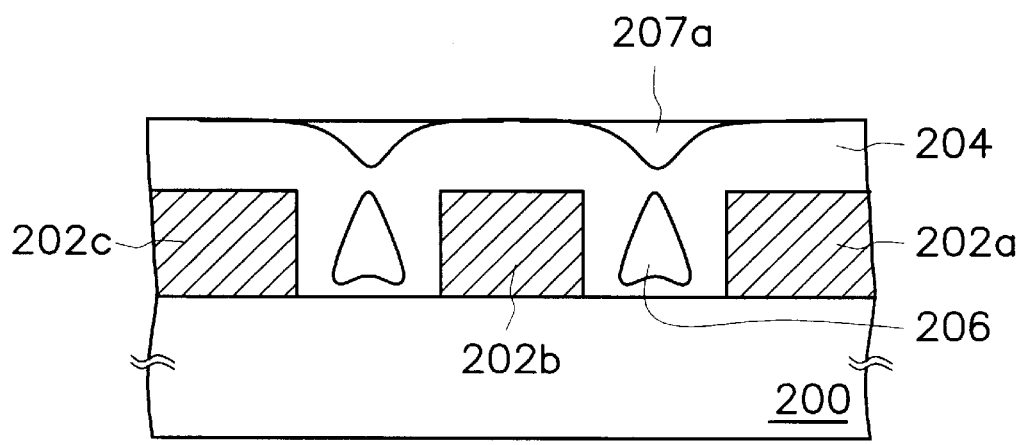

Referring to FIG. 2C, a part of the anti-etch layer 207 is removed until a part of the dielectric layer 204 is exposed, so that an anti-etch layer 207a is formed on the dielectric layer 204 above the air gap 206. The step for removing the anti-etch layer 207 includes chemical mechanical polishing (CMP). As the surface profile of the dielectric layer 204 fluctuates with the profile of the conducting wires 202 during the formation of the air gap 206, the dielectric layer 204 located above the air gap 206 is lower than the dielectric layer 204 located above the conducting wires 202. Also, the anti-etch layer 207 has a smaller polishing rate than the first dielectric layer 204 during CMP. Therefore, the anti-etch layer 207a is formed on the dielectric layer 204 above the air gap 206 after a part of anti-etch layer 207 is removed by CMP.

Figure 2D:
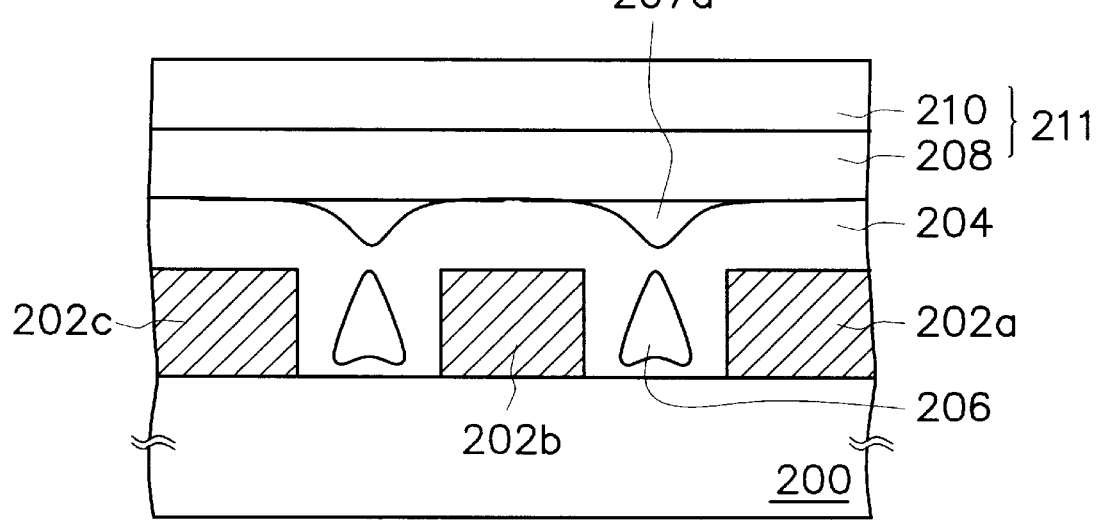

Referring to FIG. 2D, dielectric layers 208, 210 are formed in sequence on the substrate 200, wherein the dielectric layers 208, 210 have a larger etching rate than the anti-etch layer 207a. The dielectric layer 208 may include the silicon oxide layer formed by high-density plasma chemical vapor deposition (HDPCVD), while the dielectric layer 210 may include the silicon oxide layer formed by plasma enhanced chemical vapor deposition (PECVD). To simplify the description, a dielectric layer 211 represents the dielectric layers 208, 210.

Figure 2E:
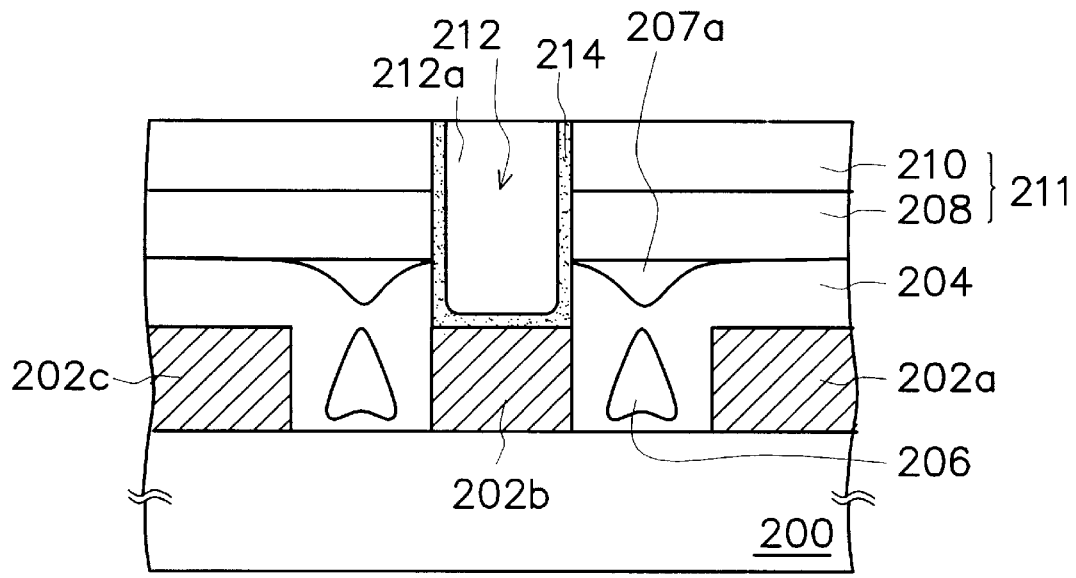

Referring to FIG. 2E, the dielectric layers 211, 204 are patterned to form a via opening 212 which penetrates dielectric layers 211, 204 and exposes the conducting wire 202b. A barrier layer 214 is then formed to cover the profile of the via opening and the conducting wire 202b exposed by the via opening 212. The barrier layer 214 may include a titanium/titanium nitride layer. A via plug is formed to fill the via opening 212, wherein the via plug may be a tungsten plug.

Figure 3:
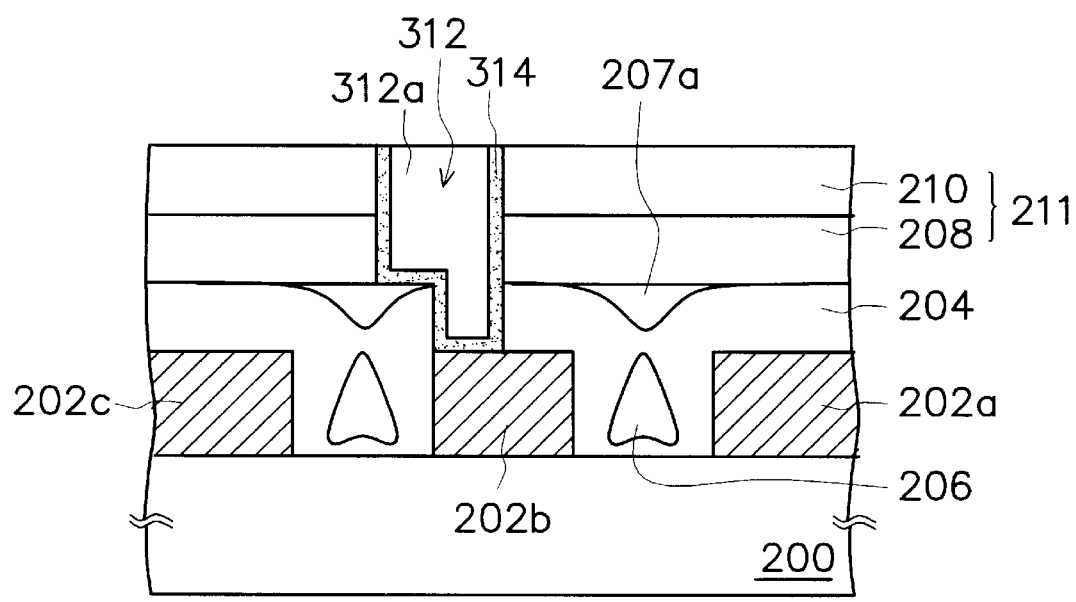
FIG. 3 is schematic diagram illustrating the via opening when misalignment occurs.

Referring to FIG. 3, a misalignment occurs during the formation of the via opening. With the exception of the via opening, the via plug formed as a result of misalignment, and the barrier layer, which are numbered 312, 312a, and 314, respectively, other elements have the same reference numbers as those shown in FIG. 2E. As the anti-etch layer 207a has a smaller etching rate than the dielectric layers 204, 208, the anti-etch layer 207a may serve as a masking layer for the dielectric layer 204 above the air gap 206 when the misalignment occurs during the formation of the via opening 312. By manipulating with the etching selectivity ratio of etching gases, only a part of the dielectric layer 211, 204 above the conducting wire 202b is etched through until the surface of the conducting wire 202b is exposed. In other words, when misalignment occurs during the formation of via opening 312, the misaligned via opening 312 does not penetrate through the dielectric layer 204 and breach the air gap 206, because the anti-etch layer provides protection for the dielectric layer 204 above the air gap 206.

In addition, the anti-etch layer 207a prevents the air gap 206 from being etched through by the via opening 312, thus the barrier layer 314 formed in the subsequent process can completely isolate the via plug 312a from the dielectric layers 211, 204.

This solves the conventional problems such as a poisoned via when the barrier layer cannot completely isolate the dielectric layer from the via plug after the air gap has been breached.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A modified implementation of air-gap low-K dielectric for unlanded via, comprising steps of:

providing a substrate with a first conducting wire and a second conducting wire formed thereon, wherein a part of the substrate between the first and the second conducting wires is exposed;

forming a first dielectric layer to cover the substrate, the first and the second conducting wires, wherein an air gap is formed in the first dielectric layer between the first and the second conducting wires;

forming an anti-etch layer on the first dielectric layer above the air gap;

forming a second dielectric layer on the anti-etch layer an the first dielectric layer;

forming a via opening which exposes the first conducting wire, without removing the anti-etch layer and the first dielectric layer above the air gap even when a misalignment occurs during formation of the via opening;

forming a barrier layer which covers a profile of the via opening and the exposed surface of the first conducting wire; and forming a via plug to fill the via opening.

2. The modified implementation of claim 1, wherein the first dielectric layer includes a silicon oxide layer formed by plasma enhanced chemical vapor deposition (PECVD).

3. The modified implementation of claim 1, wherein a part of the first dielectric layer located above the first and the second conducting wires has a thickness approximately between 2000–4000Å.

4. The modified implementation of claim 1, wherein the anti-etch layer includes silicon nitride.

5. The modified implementation of claim 1, wherein the anti-etch layer includes a titanium oxide layer formed by PECVD.

6. The modified implementation of claim 1, wherein the anti-etch layer includes a tantalum oxide layer formed by PECVD.

7. The modified implementation of claim 1, wherein the anti-etch layer has a smaller etching rate than the first dielectric layer.

8. The modified implementation of claim 1, wherein the anti-etch layer has a smaller etching rate than the second dielectric layer.

9. A fabrication method for multilevel interconnects, comprising steps of:

providing a substrate with a first conducting wire and a second conducting wire formed thereon, wherein a part of the substrate between the first and the second conducting wires is exposed;

forming a silicon oxide layer by PECVD to cover the substrate, the first and the second conducting wires, wherein an air gap is formed in the silicon oxide layer between the first and the second conducting wires;

forming a silicon nitride layer on the silicon oxide layer above the air gap;

forming a first dielectric layer on the silicon nitride layer and the silicon oxide layer;

forming a second dielectric layer on the first dielectric layer;

forming a via opening in the silicon oxide layer, the first and the second dielectric layers to expose the first conducting wire;

forming a barrier layer which covers a profile of the via opening and the exposed surface of the first conducting wire; and forming a via plug to fill the via opening.

10. The fabrication method of claim 9, wherein a part of the silicon oxide layer located above the first and the second conducting wires has a thickness approximately between 2000–4000Å.

11. The fabrication method of claim 9, wherein the silicon nitride layer has a smaller etching rate than the first dielectric layer and the second dielectric layer.

12. The fabrication method of claim 9, wherein the step for forming the first dielectric layer includes high-density plasma chemical vapor deposition (HDPCVD).

13. The fabrication method of claim 9, wherein the step for forming the second dielectric layer includes PECVD.

14. The fabrication method of claim 9, wherein the step for forming the silicon nitride layer includes PECVD.

* * * * *